United States Patent
Lopatin et al.

(10) Patent No.: US 6,815,340 B1
(45) Date of Patent: Nov. 9, 2004

(54) METHOD OF FORMING AN ELECTROLESS NUCLEATION LAYER ON A VIA BOTTOM

(75) Inventors: Sergey D. Lopatin, Santa Clara, CA (US); Paul R. Besser, Sunnyvale, CA (US); Matthew S. Buynoski, Palo Alto, CA (US); Pin-Chin Connie Wang, Menlo Park, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 192 days.

(21) Appl. No.: 10/145,928

(22) Filed: May 15, 2002

(51) Int. Cl.[7] .......................................... H01L 21/4763
(52) U.S. Cl. ..................... 438/637; 473/642; 473/707; 473/710; 473/712
(58) Field of Search ................. 438/637, 642, 438/707, 710, 712, 906

(56) References Cited

U.S. PATENT DOCUMENTS

| | | | | |
|---|---|---|---|---|
| 5,639,691 A | * | 6/1997 | Klein et al. | 438/652 |
| 5,646,448 A | * | 7/1997 | Klein et al. | 257/751 |
| 5,770,519 A | * | 6/1998 | Klein et al. | 438/639 |
| 5,985,763 A | * | 11/1999 | Hong et al. | 438/688 |
| 6,057,063 A | | 5/2000 | Liebmann et al. | |
| 6,180,518 B1 | * | 1/2001 | Layadi et al. | 438/639 |
| 6,352,917 B1 | * | 3/2002 | Gupta et al. | 438/622 |
| 6,365,502 B1 | * | 4/2002 | Paranjpe et al. | 438/622 |
| 6,410,418 B1 | * | 6/2002 | Yang | 438/626 |
| 6,543,045 B2 | | 4/2003 | Ludwig et al. | |
| 6,573,606 B2 | * | 6/2003 | Sambucetti et al. | 257/762 |
| 6,602,788 B2 | * | 8/2003 | Burke et al. | 438/688 |

OTHER PUBLICATIONS

Wolf et al., Silicon Processing in the VLSI Era, vol. 2, (Lattice Press, California) 1990, p. 264–65.*

* cited by examiner

*Primary Examiner*—Michael S. Lebentritt
*Assistant Examiner*—Christian Wilson
(74) *Attorney, Agent, or Firm*—Foley & Lardner LLP

(57) ABSTRACT

A method of fabricating an integrated circuit can include performing a reactive ion etch (RIE) to form a via aperture in a dielectric layer where the via aperture exposes a portion of a conductive layer located under the dielectric layer, removing polymer residue from the RIE, and forming a nucleation layer over the exposed portion of the conductive layer using an alloy. The nucleation layer can be formed in an electroless process and can improve electromigration reliability, reduce via resistance, eliminate via corrosion, and eliminate copper resputtering on dielectric sidewalls.

18 Claims, 2 Drawing Sheets

METHOD OF FORMING AN ELECTROLESS NUCLEATION LAYER ON A VIA BOTTOM

CROSS REFERENCE TO RELATED APPLICATIONS

This application is related to U.S. patent application Ser. No. 09/994,397, entitled METHOD OF IMPLANTING COPPER BARRIER MATERIAL TO IMPROVE ELECTRICAL PERFORMANCE filed on Nov. 26, 2001; U.S. patent application Ser. No. 09/994,400, entitled METHOD OF INSERTING ALLOY ELEMENTS TO REDUCE COPPER DIFFUSION AND BULK DIFFUSION filed on Nov. 26, 2001; U.S. patent application Ser. No. 09/994,358, entitled METHOD OF IMPLANTATION AFTER COPPER SEED DEPOSITION filed on Nov. 26, 2001; U.S. patent application Ser. No. 09/994,395, entitled METHOD OF USING TERNARY COPPER ALLOY TO OBTAIN A LOW RESISTANCE AND LARGE GRAIN SIZE INTERCONNECT filed on Nov. 26, 2001; and U.S. patent application Ser. No. 10/123,751, entitled USE OF ULTRA-LOW ENERGY ION IMPLANTATION (ULEII) TO FORM ALLOY LAYERS IN COPPER; which are all assigned to the same assignee as this application.

FIELD OF THE INVENTION

The present invention relates generally to integrated circuits and methods of manufacturing integrated circuits. More particularly, the present invention relates to forming an electroless nucleation layer on a via bottom.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of vias (or pathways between integrated circuit layers used to electrically connect separate conductive layers) decreases, electrical resistance increases.

Conventional integrated circuits utilize vias to connect structures (e.g., gates, drain regions, source regions) and conductive lines. For example, a via can connect a gate above the substrate to a conductor line in a metal 1 layer. Vias can also interconnect conductive lines. For example, a via can connect a conductive line in a metal 1 layer to a conductor line in a metal 2 layer. A via is typically a metal plug which extends through an insulative layer in a multi-layer integrated circuit. Vias and barrier layers are discussed in U.S. Pat. Nos. 5,646,448; 5,770,519; and 5,639,691; each of which are assigned to the assignee of the present application. A barrier layer is used to protect the via and insulative layer from metal diffusion and the via and conductive line from electromigration (EM). The barrier layer can contribute significantly to resistance associated with the via metal. Electromigration is the mass transport due to momentum exchange between conducting electrons and diffusing metal atoms. Electromigration causes progressive damage to the metal conductors in an integrated circuit. In general, metals are most susceptible to electromigration at very high current density and temperatures of 100° C. or more.

Integrated circuit manufacturers have attempted to reduce via resistance as the via size decreases by reducing the thickness of the barrier material. According to a conventional plasma vapor deposition (PVD) process, IC manufacturers deposit a very thin barrier material at the bottom of the via due to non-conformal deposition. The thickness of the barrier material is reduced by chemical vapor deposition (CVD) or atomic layer deposition (ALD) processes. These advanced deposition processes form highly conformal barrier metal films. However, reducing the barrier thickness causes the barrier to become more permeable to copper (Cu) diffusion, which can adversely affect resistance to electromigration.

A conventional integrated circuit can include a copper layer, a copper via, a copper layer, a dielectric layer, and a dielectric layer. The via and copper layer are separated by a barrier layer.

The integrated circuit can also include a dielectric layer that is separated from the copper layer by an etch stop layer. The dielectric layer can be oxide and the etch stop layer can be Silicon Nitride (SiN). The etch stop layer prevents diffusion of copper from the copper layer into the dielectric layer. The dielectric layer can be separated from the copper layer by a barrier layer. Barrier layers can be Tantalum Nitride (TaN). Etch stop layers can be Silicon Nitride (SiN).

According to conventional processes, the barrier layer can have a cross-sectional thickness of between 7 nm to 25 nm. The barrier layer inhibits diffusion of copper ions from layers into the via and from the via into the dielectric layer. Conventional barrier layers can include Tantalum Nitride (TaN).

As discussed above, conventional systems have attempted to reduce the thickness of the barrier layer to reduce the resistance associated with the via. However, this reduction in thickness can cause electromigration failures.

Electromigration failures have been described by Stanley Wolf, Ph.D. in *Silicon Processing for the VLSI Era*, Lattice Press, Sunset Beach, Calif., Vol. 2, pp. 264–65 (1990). Dr. Wolf explains that a positive divergence of the motion of the ions of a conductor leads to an accumulation of vacancies, forming a void in the metal. Such voids may ultimately grow to a size that results in open-circuit failure of the conductor line.

Thus, there is a need for a barrier that is more resistant to copper diffusion. Further, there is a need for a method of forming an electroless nucleation layer on a via bottom. Even further, there is a need for a method of enhancing barrier properties by providing an electroless nucleation layer on a via bottom.

SUMMARY OF THE INVENTION

An exemplary embodiment is related to a method of fabricating an integrated circuit. This method can include performing a reactive ion etch (RIE) to form a via aperture in a dielectric layer where the via aperture exposes a portion of a conductive layer located under the dielectric layer, removing polymer residue from the RIE, and forming a nucleation layer over the exposed portion of the conductive layer using an alloy.

Another exemplary embodiment is related to a method of forming a nucleation layer at a location intermediate a conductive layer and a via. This method can include providing a conductive layer over an integrated circuit substrate, performing a reactive ion etching (RIE) etch to form a via aperture in a dielectric layer positioned over the conductive layer, removing residue from the RIE etch, and providing a nucleation layer at the bottom of the via aperture, proximate the conductive layer.

Another exemplary embodiment is related to a method of forming a via in an integrated circuit. This method can include depositing a first conductive layer, depositing an etch stop layer over the first conductive layer, depositing an insulating layer over the etch stop layer, forming an aperture in the insulating layer and the etch stop layer, depositing an alloy element to form a nucleation layer at a bottom of the aperture above the first conductive layer, filling the aperture with a via material including a second alloy element to form a via, and providing a second conductive layer over the via such that the via electrically connects the second conductive layer t o the first conductive layer.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
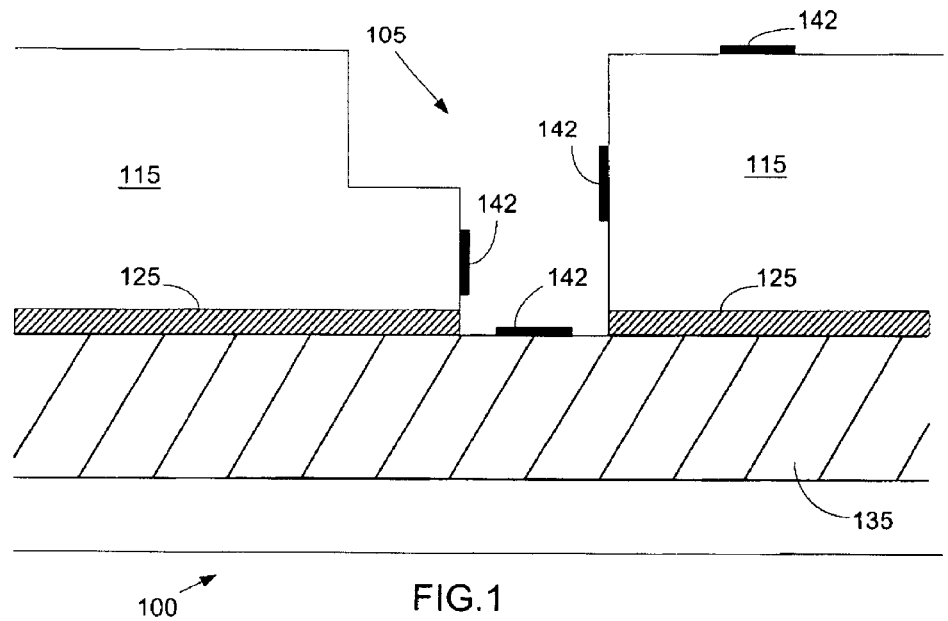
FIG. 1 is a schematic cross-sectional view representation of a portion of an integrated circuit, showing polymer residue after a reactive ion etch.

With reference to FIG. 1, a schematic cross-sectional view representation of a portion 100 of an integrated circuit (IC) includes an aperture 105, a dielectric layer 115, an etch stop layer 125, and a conductive layer 135. Portion 100 is preferably part of an ultra-large-scale integrated (ULSI) circuit having millions or more transistors. Portion 100 is manufactured as part of the IC on a semiconductor wafer, such as, a silicon wafer.

Aperture 105 is formed in preparation for the creation of a via by etching a portion of dielectric layer 115 and etch stop layer 125. In an exemplary embodiment, dielectric layer 115 is an oxide material and etch stop layer 125 is Silicon Nitride (SiN), silicon oxynitride (SiON), or other suitable material. Etch stop layer 125 prevents diffusion of copper from copper layer 135 into dielectric layer 115. Alternatively, layer 115 can be a low k dielectric material. Layer 115 can also be TEOS deposited silicon dioxide ($SiO_2$).

Conductive layer 135 can be a layer of copper positioned in proximate location to aperture 105. Copper layer 135 can be an alloy including copper (Cu). In an alternative embodiment, conductive layer 135 is a stack of several layers or a conductive layer, such as an aluminum layer including copper.

Portion 100 can include polymer residue regions 142 left after a reactive ion etching (RIE) etch. A RIE etch is a technique whereby radio frequency radiation is coupled into a low pressure gas to ionize the gas producing disassociation of the gas molecules into more reactive specie, and the substrate being etched is biased to induce ion bombardment. Compounds containing carbon (C) and halogens, such as, fluorine (F), chlorine (Cl) or Bromine (Br) are typically used as gases in a RIE etch. When the compounds disassociate in the plasma, both highly reactive halogen atoms or halogen compounds, and polymers that may deposit on the substrate blocking the highly reactive species are generated. Ions accelerated towards the substrate being etched by the applied or induced bias remove polymers on substrate surfaces oriented normal to the direction of ion motion, polymers coat substrate surfaces that are oriented parallel to the ion motion and block etching of those surfaces. Ion bombardment may also activate or accelerate chemical etching reactions.

RIE, therefore, has the capability to etch surfaces normal to the direction of ion motion at a higher relative rate and surfaces parallel to the ion motion at a lower relative rate resulting in anisotropic etching. RIE conditions can be low pressure, low ionization levels and high ion energies relative to other dry etch techniques.

Residue regions 142 from RIE can be copper (Cu)-organic/polymer residue. Residue regions 142 can be present along the top and lateral side walls of dielectric layer 115 and the bottom of aperture 105.

In an exemplary method of fabricating portion 100, once copper layer 135 is created, etch stop layer 125 is deposited over copper layer 135 and dielectric layer 115 is deposited over etch stop layer 125. A resist layer is then deposited over dielectric layer 115. The resist layer is used in the patterning and etching in dielectric layer 115 and etch stop layer 125 to form aperture 105. The resist layer is removed before depositing via material in aperture 105 and depositing a conductive layer electrically connected to copper layer 135 by the via. As explained above, a RIE etch can be used in the formation of aperture 105.

In an exemplary embodiment, via material can be formed in the via as follows. A Cu surface is treated with Ar ion sputtering and/or ammonia plasma, contaminating the Cu surface. A barrier (e.g., TaN, WN, TiSiN) is deposited on the treated Cu surface by a PVD or conformal ALD or CVD process. After the barrier is deposited, a Cu alloy seed can be deposited. After the Cu alloy seed is deposited, a Cu conductor material can be deposited by electroplating or electroless. An anneal and chemical mechanical polish (CMP) can then be provided. An advanced alloy nucleation layer can also be introduced in the via material by via cleaning and electroless deposition of thin alloy layer.

Figure 2:
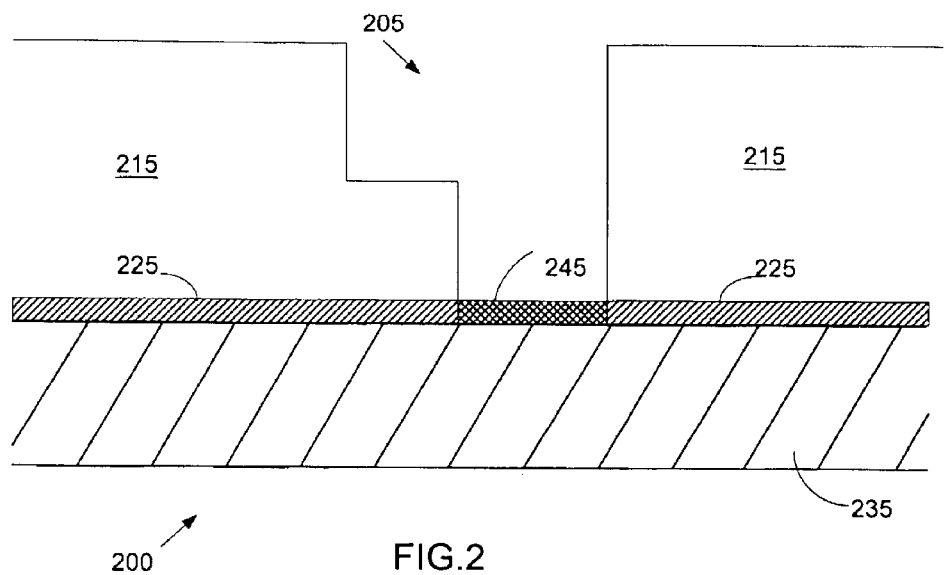
FIG. 2 is a schematic cross-sectional view representation of a portion of an integrated circuit, showing a nucleation layer formed after a chemical clean of polymer residue.

FIG. 2 illustrates a schematic cross-sectional view representation of a portion 200 of an integrated circuit (IC) includes an aperture 205, a dielectric layer 215, an etch stop layer 225, and a conductive layer 235. Portion 200 of FIG. 2 corresponds to portion 100 described with reference to FIG. 1 after a cleaning and nucleation layer formation.

Portion 200 can be chemically cleaned after a reactive ion etch (RIE) to remove remaining residue. Chemical cleaning can be done by $H_2O_2$+Citric acid+water. Alternatively, residue can be removed by diluted Sulfuric acid.

After the cleaning, an electroless nucleation layer 245 can be selectively formed at the bottom of aperture 205. Nucleation layer 245 can include, for example, a Pd alloy, Ni alloy, or Co alloy. Nucleation layer 245 can be 3–20 nm thick. Electroless nucleation layer 245 can be formed by NiP or CoWP. In an exemplary embodiment, the cleaning and nucleation layer formation are done in one chamber.

The structure of a NiP or CoWP electroless nucleation layer can be microcrystalline and the P content is lower than 7–9 atomic %. This layer has low electrical resistivity and high corrosion resistance. The structure of electroless nucleation layer becomes amorphous with increasing P concentration. The deposition process for forming nucleation layer can be designed to provide such amorphous structure. Amorphous nucleation layer can serve as a very thin barrier layer for Cu diffusion.

An alternative method to wet electroless nucleation can be a dry ALD type of process with selective W deposition. The cost of developing such process can be increased.

Advantageously, electroless nucleation layer 245 can improve electromigration reliability, reduce via resistance, eliminate via corrosion, and eliminate the possibility of Cu resputtering on dielectric sidewalls of layer 215.

Figure 3:
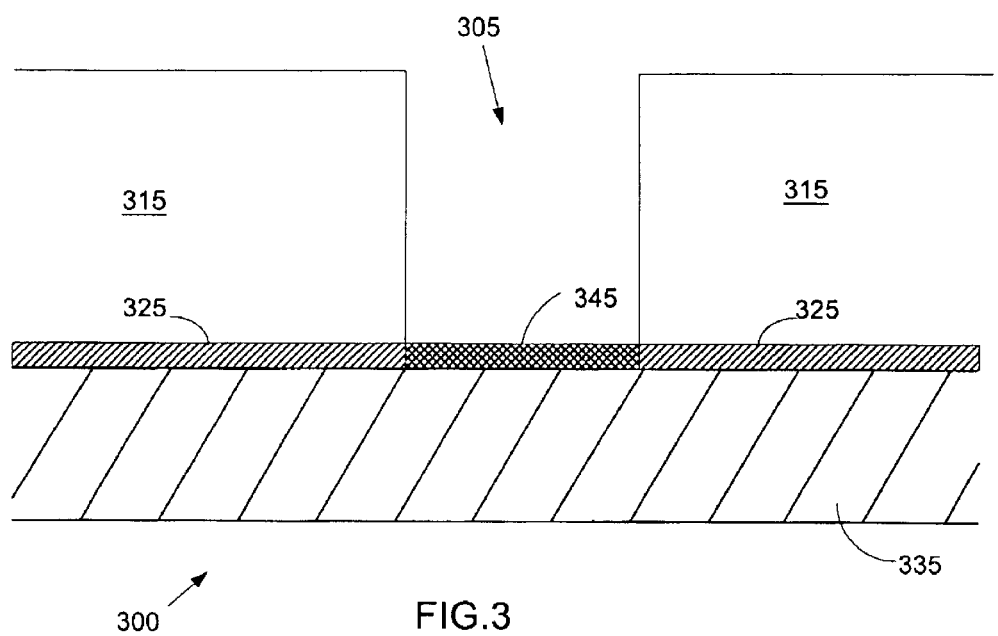
FIG. 3 is a schematic cross-sectional view representation of a portion of an integrated circuit, showing a nucleation layer formed in accordance with an exemplary embodiment.

FIG. 3 illustrates a schematic cross-sectional view representation of a portion 300 of an integrated circuit (IC) includes an aperture 305, a dielectric layer 315, an etch stop layer 325, and a conductive layer 335.

Portion 300 can be chemically cleaned after a reactive ion etch (RIE) to remove polymer residue remaining from the RIE. After cleaning, while portion 300 is in the same chamber, a nucleation layer 345 is formed at the bottom of aperture 305 in an electroless process. Nucleation layer 345 can include a Pd alloy, a Ni alloy or a Co alloy. In an exemplary embodiment, nucleation layer 345 has a thickness of between 3 and 20 nm.

Nucleation layer 345 can be a combination of two layers, such as NiP/Pd layers or CoWP/Pd layers. In this case, the Cu surface is activated with Pd and coated with NiP or CoWP. The nucleation layer is formed during 1–2 minute deposition process including approximately 30 seconds Pd activation at room temperature and NiP or CoWP nucleation at elevated temperatures of 45–95° Celsius.

While the exemplary embodiments illustrated in the FIGURES and described above are presently preferred, it should be understood that these embodiments are offered by way of example only. Other embodiments may include, for example, different cleaning methods or different alloys in the nucleation layer. The invention is not limited to a particular embodiment, but extends to various modifications, combinations, and permutations that nevertheless fall within the scope and spirit of the appended claims.

What is claimed is:

1. A method of fabricating an integrated circuit, the method comprising:
   performing a reactive ion etch (RIE) to form a via aperture in a dielectric layer, the via aperture exposing a portion of a conductive layer located under the dielectric layer;
   removing polymer residue from the RIE; and
   forming a nucleation layer over the exposed portion of the conductive layer using an alloy, wherein removing polymer residue from the RIE and forming a nucleation layer over the exposed portion of the conductive layer using an alloy are done in the same fabrication chamber.

2. The method of claim 1, wherein removing polymer residue from the RIE includes chemically cleaning the polymer residue.

3. The method of claim 1, wherein the nucleation layer has a thickness of 3–20 nm.

4. The method of claim 1, wherein the alloy comprises palladium (Pd), nickel (Ni), or cobalt (Co) alloy.

5. The method of claim 1, wherein forming a nucleation layer over the exposed portion of the conductive layer using an alloy includes forming a nucleation layer electrolessly.

6. The method of claim 1, wherein the polymer residue is C—F with Cu.

7. A method of forming a nucleation layer at a location intermediate a conductive layer and a via, the method comprising:
   providing a conductive layer over an integrated circuit substrate;
   performing a reactive ion etching (RIE) etch to form a via aperture in a dielectric layer positioned over the conductive layer;
   removing residue from the RIE etch; and
   providing a nucleation layer at the bottom of the via aperture proximate the conductive layer in the same fabrication chamber as the chamber where residue from the RIE etch is removed.

8. The method of claim 7, wherein the nucleation layer has a thickness of 3–20 nm.

9. The method of claim 7, further comprising filling the via aperture with a via material.

10. The method of claim 9, further comprising providing a conductive layer over the via material such that the via material electrically connects the conductive layer to the conductive layer.

11. The method of claim 7, wherein providing a nucleation layer includes providing an alloy using an electroless process.

12. The method of claim 11, wherein the alloy is one of palladium (Pd), nickel (Ni), or cobalt (Co) alloy.

13. A method of forming a via in an integrated circuit, the method comprising:
    depositing a first conductive layer;
    depositing an etch stop layer over the first conductive layer;
    depositing an insulating layer over the etch stop layer;
    forming an aperture in the insulating layer and the etch stop layer;
    depositing an alloy element to form a nucleation layer at a bottom of the aperture above the first conductive layer;
    filling the aperture with a via material including a second alloy element to form a via; and
    providing a second conductive layer over the via such that the via electrically connects the second conductive layer to the first conductive layer, wherein forming an aperture in the insulating layer and the etch stop layer and depositing an alloy element to form a nucleation layer at a bottom of the aperture above the first conductive layer are performed in a common chamber.

14. The method of claim 13, wherein the nucleation layer has a thickness of between 3 and 20 nm.

15. The method of claim 13, wherein the alloy element comprises one of palladium (Pd), nickel (Ni), or cobalt (Co).

16. The method of claim 13, wherein forming an aperture in the insulating layer and the etch stop layer includes performing a reactive ion etch (RIE).

17. The method of claim 16, further comprising cleaning polymer residue remains from the RIE.

18. The method of claim 17, wherein the polymer residue is C—F with Cu.

* * * * *